(12) United States Patent
Brown

(10) Patent No.: US 6,348,834 B1
(45) Date of Patent: Feb. 19, 2002

(54) LINEARIZATION OF FET CHANNEL IMPEDANCE FOR SMALL SIGNAL APPLICATIONS

(75) Inventor: David A. Brown, Indianapolis, IN (US)

(73) Assignee: Pro Tech Communications Inc., Ft. Pierce, FL (US)

( * ) Notice: Subject to any disclaimer, the term of this patent is extended or adjusted under 35 U.S.C. 154(b) by 0 days.

(21) Appl. No.: 09/570,996

(22) Filed: May 15, 2000

(51) Int. Cl.$^7$ .................................................. G05F 1/10

(52) U.S. Cl. ........................................ 327/543; 327/541

(58) Field of Search ................................ 327/427, 543, 327/541

(56) References Cited

U.S. PATENT DOCUMENTS 5,043,605 A * 8/1991 Gabara ........................ 326/73
5,905,384 A * 5/1999 Inoue et al. ................ 324/769

* cited by examiner

Primary Examiner—Toan Tran
Assistant Examiner—Linh Nguyen

(57) ABSTRACT

A system that provides a means of effectively applying a mathematical substitution to the characteristic V/I equation for FET devices operating in the ohmic region that causes the non-linear (distortion producing) term to be cancelled thereby improving the realizable channel impedance linearity by orders of magnitude. The system comprised of a means to sum an isolated specific portion of the information signal applied to the FET with the Gate controlling voltage to produce a signal value that achieves the improved linearity result when applied to the FET Gate terminal.

3 Claims, 4 Drawing Sheets

LINEARIZATION OF FET CHANNEL IMPEDANCE FOR SMALL SIGNAL APPLICATIONS

FIELD OF INVENTION

The present invention relates in general to the improved use of Field Effect Transistors as a voltage controlled impedance and their application in circuits that require dynamic analog information signal modification where low distortion is a primary metric of signal quality. Specifically, it focuses on significantly improving FET linearity by reducing channel impedance variations that result from information signal variations and are not associated with changes in the Gate controlling voltage source.

BACKGROUND OF THE INVENTION

Field Effect Transistors have been widely used in analog circuit applications as a means of dynamically controlling analog information signal parameters such as frequency, gain, phase, or bandwidth. The application of FET technology in these specific types of circuit designs provides distinct advantages over alternative bipolar technology solutions. These advantages are predominantly in the area of achieving high linearity (low distortion), high control input impedance, or low reactive parasitic impedances. This is due to the nature of the FET voltage current characteristic equations that are a result of semiconductor physics and fabrication processes.

As mentioned, there are numerous circuit applications for FET's. The most common applications relate to circuits that require a voltage controlled impedance to change the amplitude of the analog information signal being controlled. The voltage controlled impedance functionality of these devices is also widely used to dynamically change other signal parameters such as (but not limited to) frequency, phase, or bandwidth. To achieve high linearity and therefore low distortion in all of these types of applications, the FET channel impedance must electrically operate as close as possible to an equivalent value resistance for any instantaneous value of Gate-to-Source voltage in the ohmic region of the characteristic V/I curve. Although FET's have a more linear V/I curve than their bipolar transistor counterparts when used in small signal applications, the V/I curve of FET's is still inherently non-linear. To illustrate this, the first-order effect, instantaneous small signal V/I equation of an N-Channel Depletion Mode JFET operating in the ohmic region is set forth in equation (1) below as stated in Hayt and Neudeck, Electronic Circuit Analysis and Design $2^{nd}$ Edition, p.63, 1984.

$$Id = D\left([Vgs - Vp] * Vds - \frac{Vds^2}{2}\right) \quad (1)$$

In the above equation, D is a constant based on semiconductor physics, manufacturing process parameters, and physical dimensions. Vp is the FET's specified "pinch-of" voltage, Vgs is the instantaneous channel impedance controlling voltage measured between the Gate-to-Source terminals, and Vds is the instantaneous voltage value measured between the Drain and Source terminals and is the analog information signal. The inherent non-linearity of this device results from the $$\frac{Vds^2}{2}$$

term in the equation. Other types of FET's such as P-Channel Depletion Mode, N-Channel Enhancement Mode, or P-Channel Enhancement Mode have similar equations and differ only in sign and the value of their associated constants. This term within the equation implies that higher degrees of linearity can be achieved by reducing the amplitude of the analog information signal (Vds) which is a standard application technique. Using this technique however sacrifices Signal-to-Noise which is another common signal-quality figure of merit for circuits that strive to achieve low distortion.

Another means of improving linearity and thus reducing distortion is to reduce the effect of the non-linear term shown above by connecting fixed resistances (linear devices) in series and/or in parallel with the FET channel impedance (e.g. Gingrich et al., U.S. Pat No. 5,175,508, Dec. 29, 1992). Although this approach effectively improves the linearity by reducing the net effect of the non-linear term, it does so at the sacrifice of the dynamic impedance range provided by the FET. In other words, this approach seeks to mask the non-linear term but does not cancel the non-linear term.

FET channel impedance linearity can also be improved in the manufacturing process (e.g. Green, Jr., U.S. Pat. No. 5,266,506, Nov. $30^{th}$, 1993). Although this may be an effective way to achieve the high linearity goal, it involves highly controlled state-of-the-art semiconductor manufacturing processes which usually results in a significantly higher component cost. In spite of this approach's degree of improvement in FET linearity, if a specific device's characteristic equation can be shown in a mathematically similar form to equation (1), then further significant improvements in linearity could be achieved through the application of this invention. In addition, the utilization of this invention may indeed achieve greater improvements in linearity than that of Green, Jr. allowing cost effective semiconductor manufacturing processes to be used while achieving the same highly linear results.

SUMMARY OF THE INVENTION

The main objective of this invention is to significantly improve FET channel impedance linearity in semiconductor devices and analog circuit applications that require low distortion in analog information signal quality without sacrificing other performance advantages that FET's can provide such as (but not limited to) Signal-to-Noise or Dynamic Range. Through the application of this invention, the claimed improvement is realized for FET semiconductor devices and circuit applications where utilization of the FET as a voltage controlled impedance is the primary function and therefore designed to operate in the ohmic region of the characteristic small-signal V/I curve.

Another objective of this invention is to provide an improvement of FET channel impedance linearity that is not dependent upon the electrical specifications of the specific FET device or semiconductor manufacturing process being used Achievement of this objective enables the use of cost-effective components or semiconductor manufacturing processes to achieve a higher degree of information signal quality performance than would otherwise be achievable at a comparable cost.

The present invention accomplishes these objectives through the implementation of a mathematical derivation that cancels the nonlinear term contained in the characteristic voltage-to-current equation (1) for FET's operating in the ohmic region of their small-signal V/I curve. This characteristic equation models the small-signal voltage-to-current behavior of an FET operating in the ohmic region. This equation does not model the comparatively negligible second-order effects resulting from semiconductor junction and terminal parasitic impedances. Specifically, the implementation of the above mentioned derivation requires the application of a specific transfer function to the analog information signal across the Drain-to-Source terminals (Vds). The output of this transfer function is summed with the instantaneous value of the Gate controlling voltage (Vg) to produce a voltage that is applied across the Gate-to Source terminals (Vgs). This process of modifying the value of Vgs cancels the non-linear FET channel impedance variations that result from the varying analog information signal across the Drain-to-Source terminals (Vds).

Further objectives and advantages of this invention will become apparent from a consideration of the drawings and ensuing description.

DETAILED DESCRIPTION OF THE INVENTION

Figure 1:
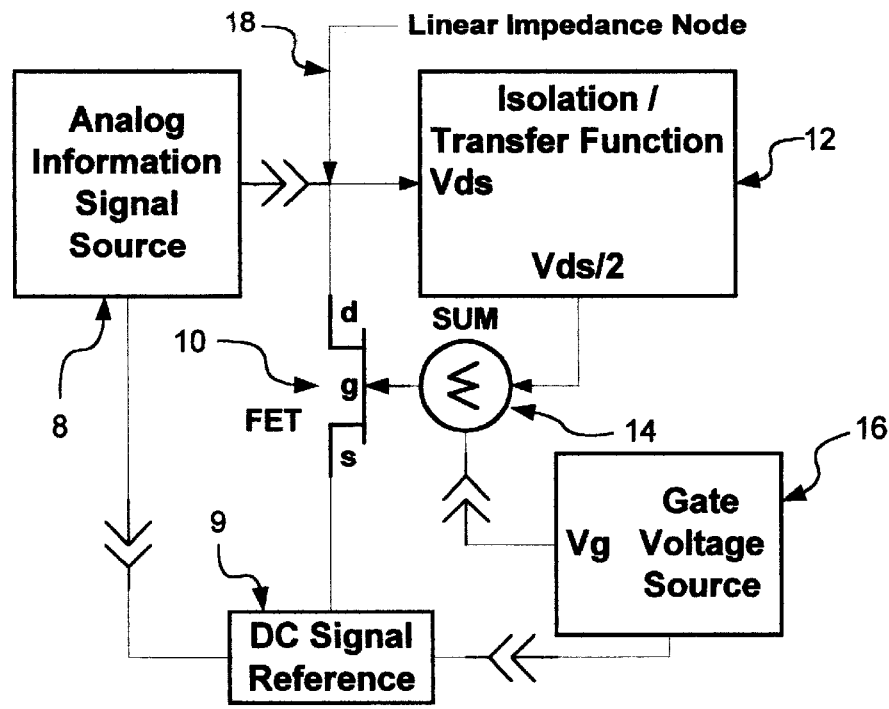
FIG. 1 is a functional block diagram of the present invention.

The derivation of the characteristic V/I equation of an N-Channel Depletion Mode JFET operating in the ohmic region is as follows (equation (1) is repeated here for completeness):

Initial equation:

$$Id = D\left([Vgs - Vp] * Vds - \frac{Vds^2}{2}\right) \qquad (1)$$

As stated in the above equation, the instantaneous FET channel current (Id) is a constant times an algebraic formula that is dependant upon the instantaneous values of the Gate-to-Source voltage (Vgs), the Drain-to-Source voltage (Vds), and the "inch off" voltage (Vp). Vgs and Vds are variables during operation while Vp is a constant value specified for the specific FET model being used and therefore does not affect linearity.

Substitution:

$$Vgs = Vg + \frac{Vds}{2} \qquad (2)$$

Resulting equation:

$$Id = D\left(\left[\left(Vg + \frac{Vds}{2}\right) - Vp\right] * Vds - \frac{Vds^2}{2}\right) \qquad (3)$$

Distribution of Vds term inside the brackets:

$$Id = D\left(Vg * Vds + \frac{Vds^2}{2} - Vp * Vds - \frac{Vds^2}{2}\right) \qquad (4)$$

Vds squared terms cancel:

$$Id = D(Vg*Vds - Vp*Vds) \qquad (5)$$

Consolidation of terms:

$$Id = Vds*D(Vg - Vp) \qquad (6)$$

Rearrange:

$$\frac{1}{D(Vg - Vp)} = \frac{Vds}{Ids} \qquad (7)$$

Identity substitution:

$$Rds = \frac{Vds}{Ids} \qquad (8)$$

Resulting equation:

$$Rds = \frac{1}{D(Vg - Vp)} \qquad (9)$$

The above derivation and subsequent result states that by adding ½ of the Drain-to-Source voltage (Vds) to the Gate controlling voltage (Vg), the resulting FET channel impedance (Rds) becomes an inverse linear function. This linear function is equal to a constant times the difference between (Vg) and the specified "pinch off" voltage for the device being used. Therefore, instantaneous values of Vg, Rds becomes constant and therefore linear when considering only first-order effects.

As stated previously, this derivation applies to other types of FET's such as P-Channel Depletion Mode, N-Channel Enhancement Mode, or P-Channel Enhancement Mode. This is because these devices have characteristic V/I equations in the ohmic region that can be reduced to an equivalent form of equation (1) and differ only in the sign of one or more of the individual terms. Therefore, only the constant values, the sign of individual terms, and possibly the sign of the equation-solving substitution would change in application of the above derivation. The end result could be shown in the same mathematical form relating Rds inversely proportional to a constant times the difference between Vg and Vp.

FIG. 1 shows the functional block diagram of the present invention. The Analog Information Signal Source 8 and Gate Voltage Source 16 are shown with broken connections to depict that these sources are application dependent and external to the present invention. The Analog Information Signal Source 8 is the source of the signal that is dynamically controlled by FET 10 by the application of a voltage originating from Gate Voltage Source 16. The specific design of these sources is not a part of this invention but are shown in their typical anticipated form and connectivity. The Analog Information Signal Source 8 is connected to DC Signal Reference 9 and has an output that connects to the Drain terminal of FET 10. The Source terminal of FET 10 is also connected to DC Signal Reference 9 thus effectively applying the analog information signal across the Drain and Source terminals of FET 10 (Vds). FET 10 is used to modify the analog information signal by applying a voltage-controlled-impedance load to the Analog Information Signal Source 8. The signal appearing across the Drain-to-Source terminals (Vds) is applied to Isolation/Transfer Function block 12. The purpose of Isolation/Transfer Function block 12 is to isolate the Linear Impedance Node 18 from electrical variations that are not originated from the Analog Information Signal Source 8 or FET 10. Block 12 also applies a Transfer Function to the input signal (Vds) so as to provide a signal output that is ½ of the value of the input voltage (Vds/2). The Gate Voltage Source 16 is referenced to DC Signal Reference 9 and has an output (Vg) that is summed with the output of Isolation/Transfer Function block 12 via Sum block 14. The resulting summed signal (Vg +Vd/2) at the output of Sum block 14 is applied t the Gate terminal of FET 10 thus effectively implementing the derivation substitution in equation (2). The application of (Vg +Vds/2) causes the channel impedance (Rds) of FET 10 to remain constant regardless of the small signal voltage variations appearing across the Drain-to-Source terminals of FET 10 (Vds) for instantaneous values of Vg. The analog information signal with improved linearity appears at the Linear Impedance Node 18 which represents the output connection. It should be noted that Linear Impedance Node 18 should be electrically isolated when connected to subsequent circuitry in an application to prevent electrical variations that are not originated from the Analog Information Signal Source 8 or FET 10 from appearing across the Drain-to-Source terminals of FET 10. Not doing so will deteriorate the improved performance achievable with the application of this invention.

Figure 2:
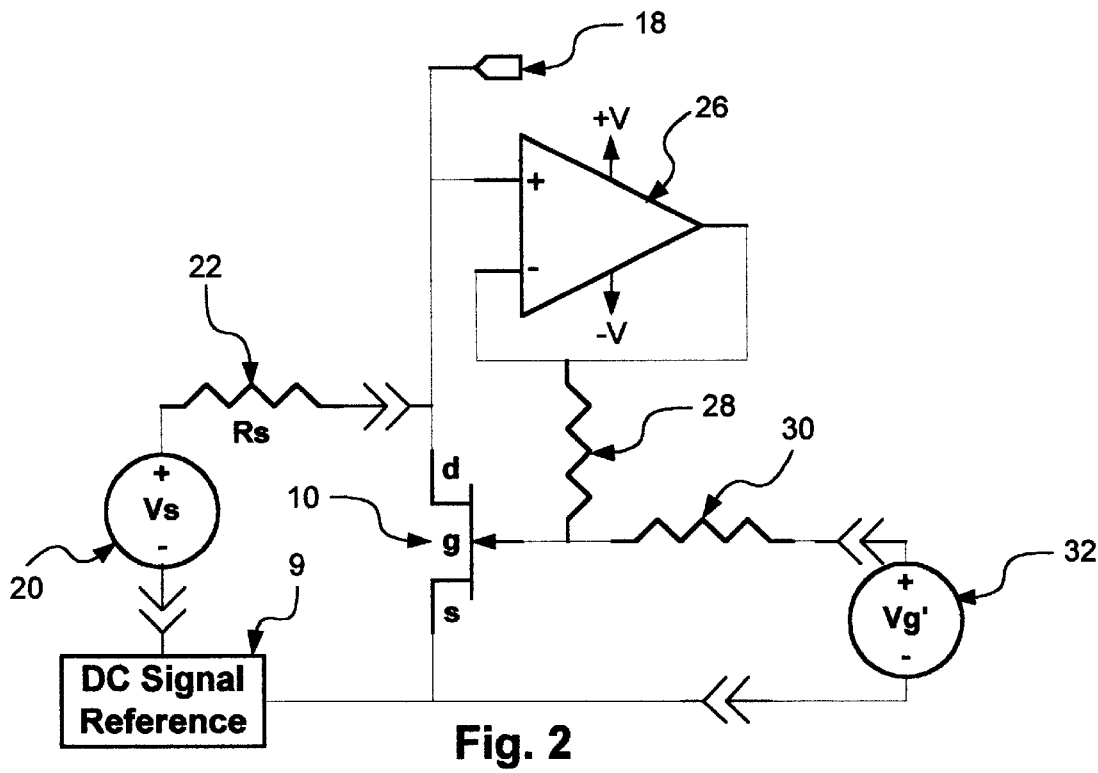
FIG. 2 is a schematic diagram of the preferred embodiment of the present invention that implements the functional block diagram of FIG. 1 in its simplest circuit form.

FIG. 2 is a circuit implementation of the invention shown in FIG. 1 and represents the preferred embodiment. This circuit utilizes the variable channel impedance of FET 10 in a voltage controlled amplitude application. The Analog Information Signal Source 8 in FIG. 1 is implemented in FIG. 2 as an ideal voltage source (Vs) 20 referenced to DC Signal Reference 9 in series with source impedance 22 which also connects to the Drain terminal of FET 10. The value of Source impedance 22 should be such that the channel impedance range of FET 10 can produce the range of information signal amplitude modification desired when applied as a load to signal source 20 (Vs) through source impedance 22 (Rs). One skilled in the art will be readily familiar with many common circuit implementations that realize Vs and Rs as shown in FIG. 2. One skilled in the art will also recognize that Vs in conjunction with Rs can be readily replaced with their Norton equivalent current source.

In FIG. 2, the Isolation portion of the Isolation/Transfer Function block 12 in FIG. 1 is implemented with a non-inverting, unity gain op amp 26 with the output being equal to the FET 10 Drain-to-Source voltage (Vds). The Gate Voltage Source 16 (Vg) of FIG. 1 is implemented as an ideal voltage source 32 in FIG. 2 (Vg') and can be readily implemented in many ways by one skilled in the art. As with the circuit implementation of Vs mentioned above, any implementation of an ideal voltage source will have a finite source impedance associated with the actual components used. The value of resistor 30 accounts for the value of this finite source impedance and is equal to the value of resistor 28 minus the source impedance of the implementation of Vg' used. Resistors 28 and 30 combine to form a voltage divider and thus the Transfer Function portion of the Isolation/Transfer Function block 12 in FIG. 1. Because the voltage divider of resistor 28 and resistor 30 is connected between the low impedance output of op amp 26 and the output of the Gate voltage source (Vg'), their voltage values are summed and divided at the junction of resistor 28 and resistor 30. This effectively implements the Sum block 14 in FIG. 1 if the value of Vg' in FIG. 2 is equal to 2Vg in FIG. 1. This is because of the voltage divider effect on Vg'. The value of the output of the voltage divider is therefore equal to Vds/2+Vg when the above criteria is satisfied and is applied to the Gate terminal of FET 10 to complete the circuit implementation of the invention shown in FIG. 1. The Linear Impedance Node 18 in FIG. 2 retains the same design considerations mentioned above when applying this invention to subsequent circuitry. However, the embodiment of FIG. 2 provides an alternative output from that of FIG. 1 that satisfies the application criteria. The output of op amp 26 is a low impedance output that is isolated from Linear Impedance Node 18 and provides a signal that is equal to that appearing at Linear Impedance Node 18 in FIG. 1.

Figure 3:
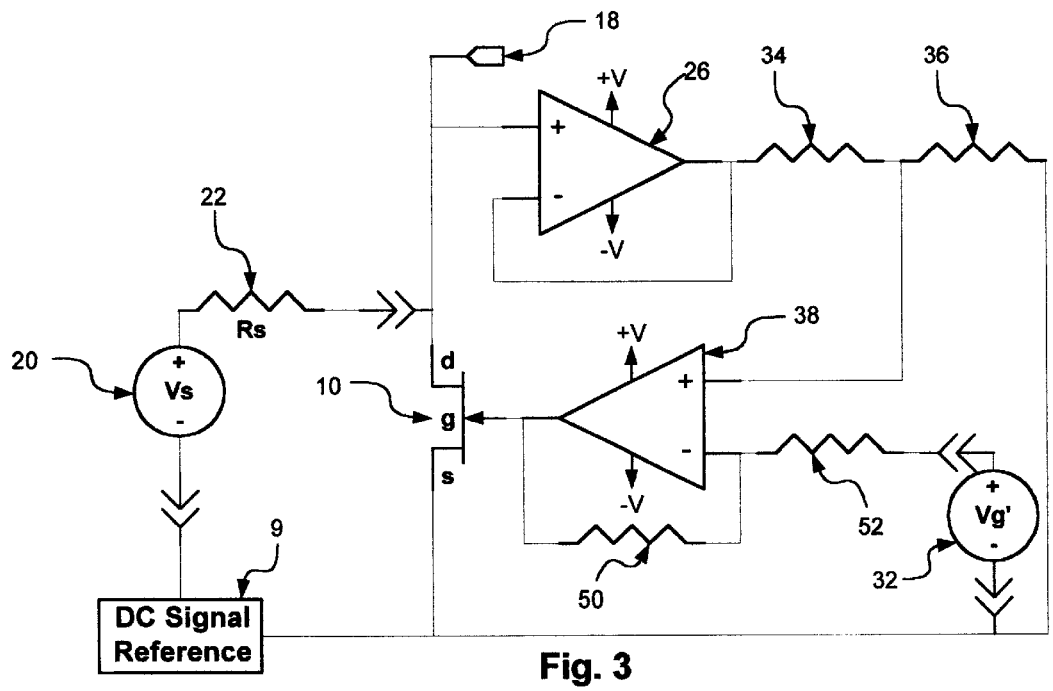
FIG. 3 is a schematic diagram of an alternative embodiment of the present invention that provides a means of inverting the polarity of Gate-to-Source controlling voltage without modifying the effective functionality of the preferred embodiment.

FIG. 3 is an alternative embodiment of the present invention shown in FIG. 1 that is a variation of the embodiment in FIG. 2. The circuit implementation FIG. 2 provides an alternative means of implementing the Sum block in FIG. 1 that enables the polarity and amplitude of Gate voltage 32 (Vg') to be modified while retaining the functionality of the present invention conveyed in FIG. 1. In FIG. 3, op amp 38 is used to implement the Sum block 14 of FIG. 1 by adding the signal appearing at the positive input terminal with the inverted and amplified voltage from Vg'. As in FIG. 2, the output of op amp 26 is equal in value to Vds. In the embodiment of FIG. 3, resistor 34 and resistor 36 form a voltage divider between the output of op amp 26 and DC Signal Reference 9. Because the junction of resistor 34 and resistor 36 connected to a non-inverting op amp gain stage, the value of resistor 50 and resistor 52 will determine the relative values of resistor 34 and resistor 36 as well as the amplitude and polarity of Vg' to achieve the same result (Vds/2+Vg) at the output of op amp 38. This is due to the 1+Rf/Ri gain calculation for the signal at the positive input of op amp 38 and the —Rf/Ri calculation for the gain applied to Vg'. One skilled in the art will readily recognize that Vg' and resistor 52 can be replaced with their Norton equivalent current source without a change in functionality. In addition, it would be readily clear that op amp 26 could be replaced with a short thereby connecting resistor 34 directly to Linear Impedance Node 18. This is feasible without sacrificing performance if the values of resistors 34 and 36 are chosen to be large enough so that their series combination when connected in parallel with the Drain-to-Source terminals of FET 10 do not affect the channel impedance range desired This modification could affect the sum of the values of resistors 34 and 36 required but not change their relative magnitudes. It would also eliminate the low impedance isolated output provided by op amp 26.

Figure 4:
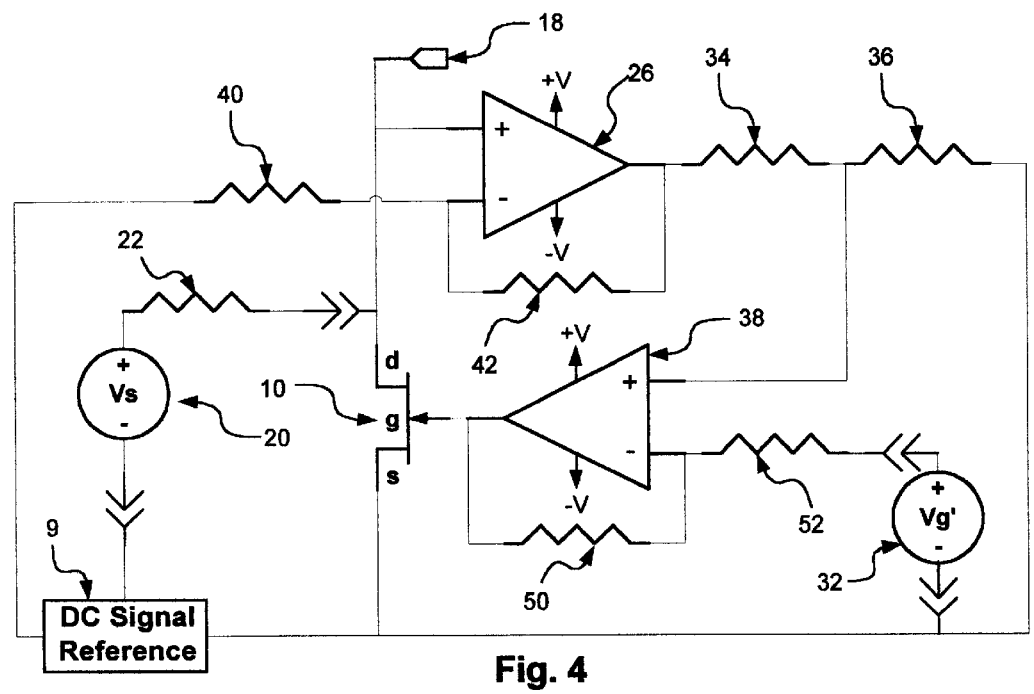
FIG. 4 is a schematic diagram of an alternative embodiment of the present invention that provides a means of including signal gain in the Isolation block of FIG. 1 without modifying the effective functionality of the preferred embodiment.

FIG. 4 is an alternative embodiment of the invention conveyed in FIG. 1 that is a variation of the embodiment shown in FIG. 3. This variation implements the Isolation block 12 in FIG. 1 as a non-inverting amplifier with gain through the addition of feedback resistor 42 and input resistor 40 to non-inverting op amp 26. The implementation of this variation only requires a modification of the relative values of resistors 34 and 36 to compensate for the increased gain in op amp 26 when comparing the implementation of FIG. 4 to that of FIG. 3.

Figure 5:
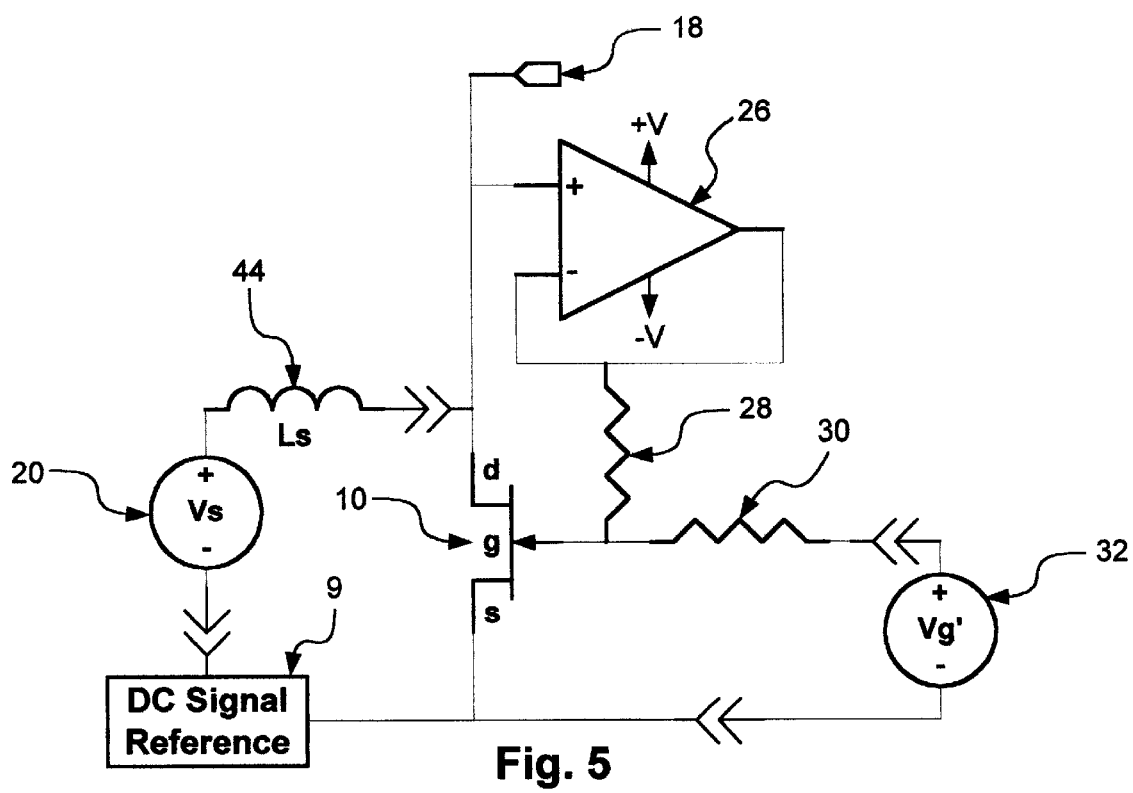
FIG. 5 is a schematic diagram of an alternative embodiment of the present invention that utilizes the improved FET channel linearity to implement a low distortion, voltage controlled Low Pass Filter.

FIG. 5 is an alternative embodiment of the invention conveyed in FIG. 1 that is a variation of the embodiment in FIG. 2 that utilizes the present invention to implement a low-distortion voltage controlled Low Pass Filter. This is accomplished by replacing source impedance 22 (Rs) in FIG. 2 with an inductance 44 (Ls) as shown in FIG. 5. As the channel impedance of FET 10 is varied by the instantaneous value of Vg', the cutoff frequency of the information signal appearing at the Linear impedance Node 18 will vary. As with the other embodiments presented, the output information signal will have the improved-linearity signal quality characteristics provided by the application of this invention. In addition, one skilled in the art will readily recognize that the inductance 44 (Ls) can be readily replaced with a capacitance to implement a voltage controlled High Pass Filter that will have the same benefit of improved linearity through the application of this invention. Although Ls and its possible alternate Cs are not a specific part of the present invention, FIG. 5 is used to illustrate other applications that could readily use this invention.

Figure 6:
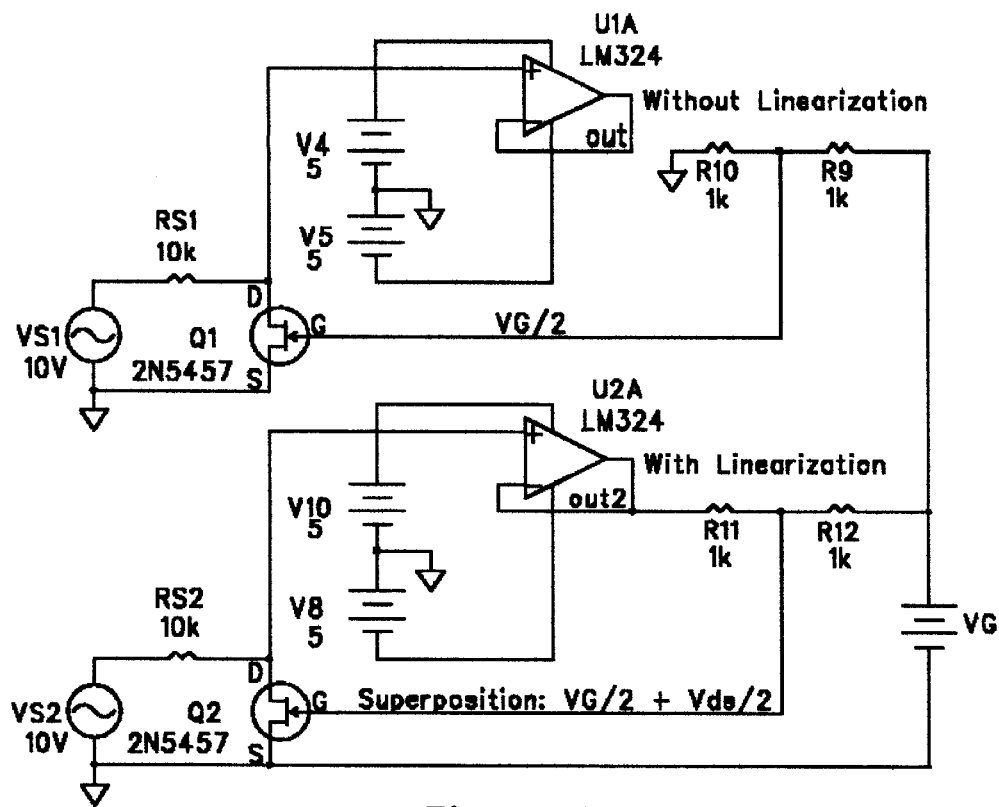
FIG. 6 is a schematic used in circuit simulation to illustrate the improved linearity achieved through application of the present invention.

To illustrate the potential magnitude of the improved FET channel impedance linearity that can be achieved through the application of the present invention, circuit simulation was used. FIG. 6 shows a schematic of two simulation circuits that are the equivalent to the embodiment conveyed in FIG. 1 and are identical with the exception that one circuit implements the present invention while the other does not. Specifically, the circuit that does not implement the present invention is missing the Vds/2 addition to the signal value appearing at the Gate-to-Source terminal of Q1 (Vgs). These circuits simulate the use of an industry standard low-cost JFET (2N5457) and op amp (LM324). The circuits are simulated with a zero volt controlling Gate voltage which biases the JFET's at their lowest channel impedance operating point. The analog information signal modeled is a 1 Khz, 10 Vp sinusoid.

Figure 7:
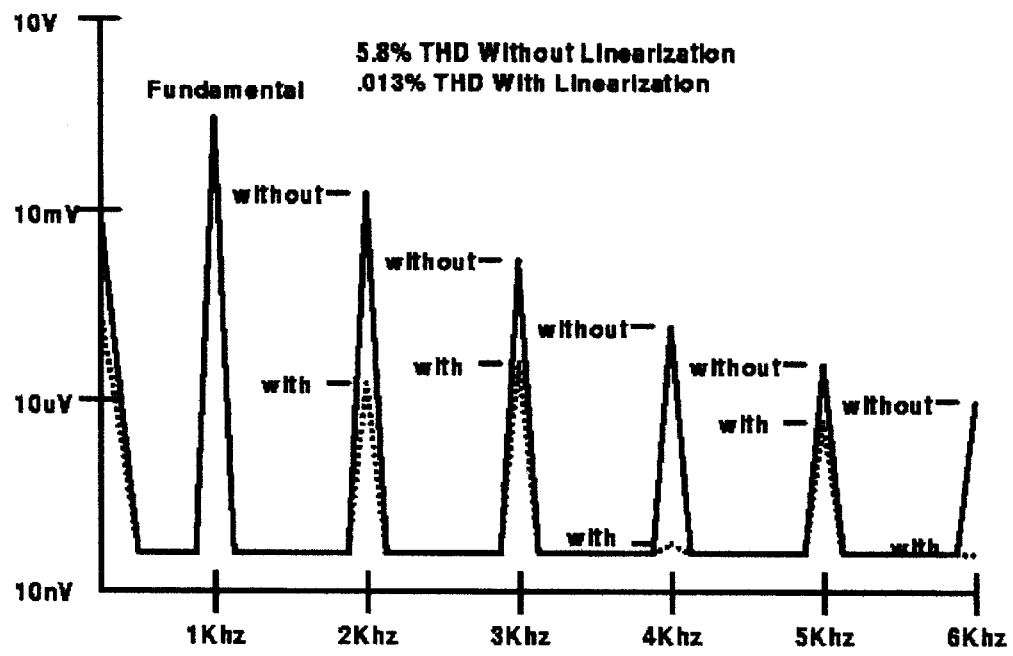
FIG. 7 is a plot of the simulation results for the circuit shown in FIG. 6 and illustrates the significantly improved FET channel impedance linearity claimed in this invention.

The simulation results presented in FIG. 7 show the relative magnitude of the first 5 harmonics of the output signals at "out" and "out2". Here it is shown that the application of the present invention reduced Total Harmonic Distortion in a 300 m Vp signal by 54 dB to a value of 0.012% verses 5.8% for the circuit without the invention applied. These results are similar in magnitude to actual results obtained in laboratory tested circuits where the typical improved linearity was on the order of 40 bB or greater.

CONCLUSIONS, RAMIFICATIONS, AND SCOPE

From the detailed description above, the significance of the discovered mathematical derivation and it's startling result to the FET small signal characteristic V/I equation will be readily apparent to one skilled in the art. The very nature of the invention lends itself readily and cost effectively to both discrete component design or semiconductor integration. The magnitude of FET channel impedance linearity improvement that can be achieved through the application of the present invention has the potential to replace costly semiconductor fabrication processes or be used to further improve linearity for devices needing extraordinary linear performance. Application of this invention can provide levels of linearity with common FET devices that can only be matched by significantly higher cost components, significantly more complex and costly circuits, or Digital Signal Processing technology and its associated expense. All of these advantages can be realized without sacrifice of other performance metrics such as Signal-to-Noise, Dynamic Range, or Frequency Bandwidth.

The possible applications of a cost-effective dynamically variable linear impedance to circuit and semiconductor solutions are obviously so numerous that the detailed description of the applications of the invention presented can only scratch the surface by covering only the most common.

Therefore, the scope of the invention should be determined by the appended claims and not solely on the embodiments illustrated.

What is claimed is:

1. A system for linearizing the drain-to-source impedance, Rds, of a field effect transistor device electrically biased in its ohmic region and having a gate terminal, a source terminal, and a drain terminal, said field effect transistor operating electrically in a manner that is mathematically modeled by a small-signal, characteristic, voltage-to-current equation containing a non-linear term, said system providing a means to apply a summation function to a control voltage, Vg, used to vary said drain-to-source impedance and a portion of the voltage across said drain terminal and said source terminal, Vds, and apply the output of said summation function across said gate terminal and said source termial, Vgs, whereby said summation function can be mathematically modeled as a substitution in said characteristic equation whose derivation after said substitution cancels said non-linear term.

2. The system in claim 1 wherein said small-signal, characteristic, voltage-to-current equation can be modeled as a mathematical equivalent with only a change in term signs to:

$$Id = D\left([Vgs - Vp] * Vds - \frac{Vds^2}{2}\right),$$

wherein Id is the instantaneous current flowing through said drain terminal, D is a constant, Vp is said field effect transistor's specified pinch-off voltage, Vds is the instantaneous voltage between said drain terminal and said source terminal.

3. The system in claim 1 wherein the output of said summation function can be modeled as a mathematical eqivalent with only a change in term signs to:

$$Vgs = Vg + \frac{Vds}{2},$$

wherein Vg is said control voltage, Vgs is the instantaneous voltage between said gate terminal and said source terminal, Vds is the instantaneous voltage between said drain terminal and said source terminal.

* * * * *